United States Patent [19]

Hainsey et al.

[11] Patent Number: 5,446,521

[45] Date of Patent: Aug. 29, 1995

[54] PHASE-SHIFTED OPAQUING RING

[75] Inventors: Robert F. Hainsey, Portland, Oreg.; Giang T. Dao, Fremont, Calif.

[73] Assignee: Intel Corporation, Santa Clara, Calif.

[21] Appl. No.: 319,475

[22] Filed: Oct. 7, 1994

Related U.S. Application Data

[63] Continuation of Ser. No. 85,402, Jun. 30, 1993, abandoned.

[51] Int. Cl.6 ............................................. G03B 27/28
[52] U.S. Cl. .................................. 355/53; 250/492.1; 356/400; 378/34; 355/125
[58] Field of Search ............... 250/505.1, 492.1, 492.2; 355/125, 53, 71; 356/400, 401; 378/34, 35

[56] References Cited

U.S. PATENT DOCUMENTS

| | | |
|---|---|---|
| 4,231,811 | 11/1980 | Somekh et al. . |
| 4,360,586 | 11/1982 | Flanders et al. . |
| 4,890,309 | 12/1989 | Smith et al. . |
| 5,045,417 | 9/1991 | Okamoto . |
| 5,135,609 | 8/1992 | Pease et al. . |
| 5,187,726 | 2/1993 | White .......................... 378/35 |
| 5,216,257 | 6/1993 | Brueck et al. ............... 250/548 |
| 5,250,983 | 10/1993 | Yamamura .................... 355/125 |

FOREIGN PATENT DOCUMENTS

| | | |
|---|---|---|
| 0395425 | 10/1990 | European Pat. Off. . |
| 0492630 | 7/1992 | European Pat. Off. . |

OTHER PUBLICATIONS

H. Hasegawa, A. Imai, T. Terasawa, T. Tanaka, F. Murai. *The Japan Society of Applied Physics and Related Societies* "Extended Abstracts 29p-ZC-3, Submicron Lithography Using Phase Mask (9): Halftone Phase Shifting Mask" 1991.

K. Nakagawa, N. Ishiwata, Y. Yanagishita, Y. Tabata. *The Japan Society of Applied Physics and Related Societies* "Extended Abstracts 29p-ZC-2, Phase-Shifting Photolithography Applicable to Real IC Patterns" 1991.

Lin, Burn J. "The Attenuated Phase-Shifting Mask" *Solid State Technology* Jan. 1992.

Andrew R. Neureuther, "Modeling Phase Shifting Masks", Preliminary Version of BACUS Symposium Paper, Dept. of Electrical Engineering and Computer Sciences, University of California Berkeley, Calif. 94720, Sep. 26, 1990 pp. 1–6 and Figures 1-13.

*Primary Examiner*—Michael L. Gellner
*Assistant Examiner*—D. P. Malley
*Attorney, Agent, or Firm*—Blakely, Sokoloff, Taylor & Zafman

[57] ABSTRACT

An attenuated phase-shifted reticle is disclosed. The reticle comprises a device region and a scribeline region. The scribeline region further comprises metrology cells, which contain features to be patterned for the purpose of measurement, etc. Other portions of the scribeline region comprise a sub-resolution pattern of, for example, lines and spaces 180° out of phase. Since the pattern is sub-resolution, it will not print. Since the pattern comprises features 180° out of phase, the intensity of radiation underneath the pattern is significantly reduced. Therefore, in a lithography method incorporating multiple exposures of the scribeline region, the metrology cells are not overexposed by the overlapping exposures in the stepping system.

48 Claims, 10 Drawing Sheets

PHASE-SHIFTED OPAQUING RING

This is a continuation of application Ser. No. 08/085,402 filed Jun. 30, 1993, now abandoned.

BACKGROUND OF THE INVENTION

1. Field of the Invention

The present invention relates to reticles used in patterning radiation sensitive layers, and more specifically to a reticle using attenuated phase-shifting for use in a lithography system and method incorporating multiple exposures of the scribeline region.

2. Background Information

In the semiconductor industry, there is a continuing effort to increase device density by scaling device size. State of the art devices currently comprise device features having dimensions well below 1 micron (submicron). To form these features, a photosensitive layer is formed on a substrate or device layer, and is exposed to radiation through a reticle (also referred to as a mask). The reticle typically comprises a substantially transparent base material with an opaque layer having the desired pattern formed thereon, as is well known. At the submicron level, diffraction effects become significant, resulting in exposure of portions of the photoresist layer underlying the opaque layer near the edges of features.

To minimize the effects of diffraction, phase-shifted reticles have been used in the prior art. Typically, a phase-shifted reticle has an opening in the opaque layer corresponding to the pattern to be formed. Phase-shifters, which transmit the exposing radiation and shift the phase of the radiation approximately 180° relative to the openings, lie along or near the outer edges of the features. The radiation transmitted through the phase-shifter destructively interferes with radiation from the opening, thereby reducing the intensity of radiation incident on the photoresist surface underlying the opaque layer near a feature edge.

Another type of phase-shifted mask is the attenuated phase-shifted mask (APSM). The APSM replaces the opaque layer of prior art masks (which is typically a layer of chrome about 0.1μ thick) with a "leaky" layer which transmits a reduced or attenuated percentage of the radiation incident thereon. For example, a very thin layer of chrome (approximately 300 Å) could be used as the leaky layer. A chrome layer this thin will transmit approximately 10% of the radiation incident on the reticle. Additionally, the leaky chrome layer shifts the phase of the transmitted radiation approximately 20°–30° compared to radiation transmitted through regions of the reticle where the leaky chrome layer is not present ("openings" in the leaky chrome layer). In order to achieve the desired 180° shift, an additional transparent layer can be added to the portion of the reticle having the attenuating layer, or the openings can be phase-shifted an additional 150°, either by etching the reticle base or by placing a phase-shifting material in the openings. Thus, an APSM used to pattern a positive photoresist layer comprises a layer of leaky chrome covering the entire reticle base, except for the features, which are open regions (i.e. regions having no thin chrome layer) with appropriate additional phase-shifting. Since the radiation transmitted through the features is phase-shifted 180° relative to radiation transmitted through the leaky chrome layer, phase-shifters are not required. Although the leaky chrome transmits less radiation than the openings, such that radiation transmitted through this region does not completely cancel the diffracted radiation from the edges of the features, there is still a sufficient cancellation to reduce the effects of diffraction so as to improve the resolution compared with non phase-shifted reticles. While the nonattenuated phase-shifters placed next to the edges of features, described above, result in more complete cancellation, in some applications the APSM may be advantageous compared with the use of the non-attenuating phase-shifters. For example, in fabricating the APSM, feature definition and phase-shifting can be performed with a single masking step, eliminating the problem of misalignment between feature and shifter. Further, the APSM can be used for certain types of features for which it is impossible or impractical for form phase-shifters.

Since the leaky chrome layer of the APSM transmits about 10% of the exposing radiation, regions away from the openings are partially exposed. In a positive photoresist, this partial exposure removes some of the photoresist from these regions, but a continuous layer remains. The photoresist layer thickness is adjusted for this exposure. For example, if the photoresist layer underneath the leaky chrome is reduced in thickness 1,000 Å due to the exposure, and a 10,000 Å, layer of photoresist after developing is desired, an initial photoresist layer of 11,000 Å will be used. In the case of a negative photoresist, the partial exposure through the attenuating layer is insufficient to harden the resist, so that portions of a negative resist exposed through the attenuating layer will be removed upon developing. The leaky chrome layer is also referred to as an "absorptive phase-shifter" and as a "halftone chrome layer." As an alternative to the leaky chrome layer, an attenuating layer having a thicker chrome layer with a sub-resolution pattern formed therein is described in co-pending U.S. patent application Ser. No. 07/952,061 filed Sep. 25, 1992 entitled "Attenuated Phase-Shifted Reticle Using Sub-Resolution Pattern," which application is assigned to the assignee of the present application, and which application is hereby incorporated by reference.

Figure 1:
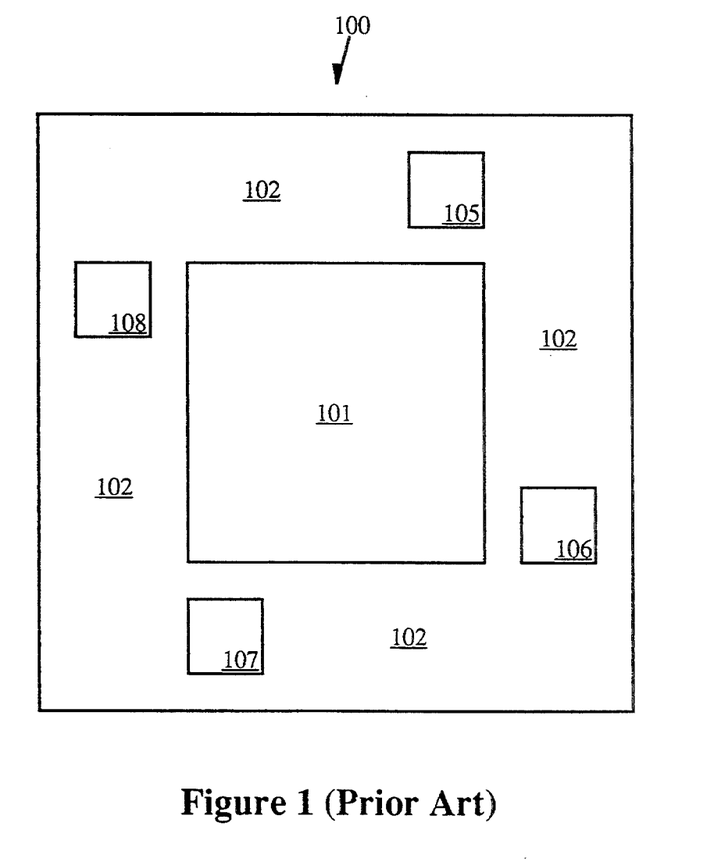
FIG. 1 shows a prior art attenuated phase-shifted mask.

A problem occurs in APSM's used in any type of stepping system, such as a step and repeat or a step and scan system, where only a portion or "stepping field" of the wafer is exposed at one time. In these types of systems a first stepping field is stepped to and exposed, followed by stepping to the next stepping field which is similarly exposed. This is repeated until all stepping fields on the wafer have been exposed. As is well known, these stepping fields often overlap, typically in the region between the individual die, known as the scribeline region. FIG. 1 shows an example of a portion of a prior art reticle 100 used in such systems. Region 101 is the portion of the reticle having the pattern for the device die, which contains openings formed in the attenuating layer to define the active device features as described above. Region 102 surrounding region 101 is the above-described scribeline. This region comprises the unpatterned attenuating chrome layer which is typically supplied on the reticle blank. Also present in scribeline region 102 are the metrology cells 105–108. These regions contain various patterns which are used for measurements during manufacturing. For example, these metrology cells 105–108 may contain critical dimension (CD) measurement features, alignment verniers, resolution patterns, etc.

Figure 2:
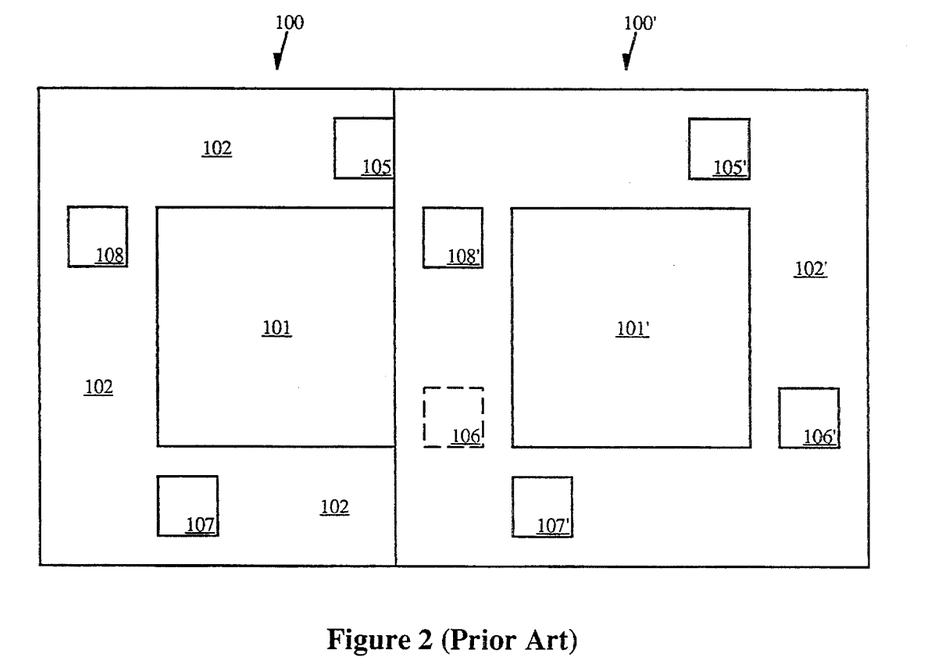
FIG. 2 illustrates exposure of two stepping fields using the mask of FIG. 1.

In stepping systems, the system exposes adjacent stepping fields as shown in FIG. 2, where the second exposure is denoted using the numerals of FIG. 1 with a prime (') symbol. Typically, the exposure overlaps along the scribeline region 102. As shown, the right-hand portion of the scribeline region 102 of the first exposure is overlapped by the left-hand portion of the scribeline region 102' of the second exposure. The overlap region is shown as 201 in FIG. 2. As shown, metrology cell 106 of the first exposure, shown dashed, is overlaid by the second exposure. Similarly, as the next row underneath the row shown in FIG. 2 is exposed, the top and bottom portions of the scribeline region will similarly overlap. In some systems, more than one die may be present in a stepping field; however, there is typically overlap in the scribeline region at the top, bottom, and either end of the multiple die stepping field.

As mentioned above, the attenuating layer of reticle 100 transmits approximately 10% of the incident radiation. While a single exposure does not cause any problems in the field region away from the openings as described above, the additional blanket exposure that occurs in the scribeline region results in multiple exposure of the metrology cells 105–108, causing a significant degradation of these patterns upon development. In some cases, the resist layer may be completely exposed resulting in essentially complete removal (positive resist) or hardening (negative resist). Thus, the metrology features used to control the device fabrication process cannot be successfully patterned, resulting in loss of in-line measurement, accurate overlay of successive layers at the wafer level, and control of the process. As shown in FIG. 2, all portions of scribeline region 102 will be exposed at least two times, and some portions, e.g. the corners, will be exposed up to four times. Note that in prior art, non-attenuated masks, scribeline regions 102, outside of metrocells 105–106, can be made of a thick, completely opaque layer of chrome. With the layout of metrocells 105–108 shown in FIGS. 1 and 2, this would result in each metro cell being completely blocked from multiple exposure during stepping. However, it is not practical to form the scribeline regions 102 of a thick layer of chrome on an APSM, as the region 101 would have to be masked while additional chrome is deposited and then etched from regions 102 during the fabrication of reticle 100. Such a procedure would require complex processing, and would add to the defect density of the reticle. In addition to the metrology cells 105–108, there may be other features, such as trademarks, logos, copyright or maskwork notices, etc., which are to be printed in the scribeline region 102. Finally, other processing steps or manufacturing requirements may dictate whether the scribeline region 102 is to be masked or unmasked, so that the overlapping exposure will limit the ability to control the masking of this region. For example, in some cases the manufacturer may desire to leave some or all of the scribeline region 102 masked for subsequent processing. In a positive photoresist, the overlapping exposures as described above, will cause partial to complete removal of the resist layer upon development. Even if a partial layer is left, subsequent etch processing, for example, may remove the partial layer, resulting in unwanted etching of these regions. The undesired patterns thus formed can lead to further defects in subsequent processing steps. Similarly, in some cases, the manufacturer may desire to leave the scribeline region 102 unmasked. In a negative photoresist the overlapping exposures may result in the scribeline region 102 being masked, again contrary to the manufacturer's requirement.

What is needed is an attenuated phase-shifted reticle for use in a method and system wherein multiple exposure at the edge of each stepping field occurs. The reticle and method should avoid costly and complex processing, yet allow for the patterning of features in the multiple exposure regions.

SUMMARY OF THE INVENTION

An attenuated phase-shifted reticle is disclosed. In a preferred embodiment, the scribeline regions contain a sub-resolution pattern of, for example, lines and spaces phase-shifted with respect to each other. Alternating ones of the lines and spaces may contain the attenuating layer typically provided with the reticle blank, or may have this layer removed. Since the lines and spaces are sub-resolution, the pattern will not print. Since they are phase-shifted, the intensity of radiation at the photoresist layer is significantly reduced. With the reduced intensity, features in the scribeline region which are exposed in one stepping will not become overexposed when exposed to a portion of the sub-resolution pattern in the scribeline region of an adjacent, overlapping stepping field.

Other features and advantages of the present invention will be made apparent from the detailed description, figures, and claims which follow.

BRIEF DESCRIPTION OF THE DRAWINGS

The present invention is illustrated by way of example and not limitation in the figures in which.

DETAILED DESCRIPTION

A phase-shifted opaquing ring is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

A variety of materials and equipment can be used. The present invention may be practiced using any type of photosensitive layer, including positive photoresist, negative photoresist, contrast enhanced photoresist, and resist materials that are patterned using radiation having a wavelength outside of the visible light spectrum. Other materials, such as an anti-reflective coating, for example, may be used with a resist layer. The reticle may be made of many different materials. A reticle base or substrate may comprise quartz, glass, silicon, silicon nitride, silicon oxynitride, or boron nitride. A thin layer of chrome, gold, copper, or other material may be used for the attenuating layer. Alternatively, the APSM of the patent application referred to in the Background may be used. In the embodiments described herein, the reticle base is made of quartz and the attenuating layer comprises a layer of chrome having a thickness of approximately 300 Å which transmits approximately 10% of the incident exposing radiation and which shifts the phase of the radiation approximately 20°–30° compared with radiation which has not passed through the attenuating chrome layer. In a preferred embodiment, phase-shifting in addition to that contributed by the attenuating chrome layer is accomplished through use of regions of different quartz thicknesses as described below. Alternatively, phase-shifting may be accomplished by adding a thickness of other materials to the appropriate region of the reticle. For example, phase-shifting may be accomplished by placing a material including, but not limited to, photoresist, silicon dioxide (doped or undoped), spin-on-glass, polyimide, silicon nitride, silicon oxynitride, and poly (methyl methacrylate)in the appropriate region. In the present specification, the shorthand terminology of one region being "phase-shifted" in relation to another region or having a "phase-shift" or similar terminology will be used to indicate that radiation transmitted through one region is shifted in phase compared with radiation transmitted through the other region. Furthermore, in describing the fabrication of a reticle, similar terminology is employed to indicate that a sufficient thickness of material is added to or removed from the appropriate region to cause a relative phase-shift between radiation transmitted through the two regions. Finally, while the phase-shift is described in terms of ranges of degrees, such as a phase-shift of approximately 160°–200°, it will be understood that this range encompasses the recited range ±n*360° where n is an integer of 0 or greater. Finally, it will be appreciated by one skilled in the art that the amount and sign of phase-shift between two regions is relative to the region defined as the zero region and the direction defined as positive so that a phase-shift of, for example, +160° is equivalent to a phase-shift of −200°. In many applications, the direction of phase-shift (positive or negative), is unimportant, so that a phase-shift of +160° is equivalent to a phase-shift of +200°, etc.

The present invention may be used with any lithographic printer regardless of radiation wavelength, partial coherence, and numerical aperture. Commercially available lithographic printers typically operate at a wavelength λ of approximately 436 nm or less and have a lens with a numerical aperture (NA)in the range of approximately 0.17–0.6 and an image reduction factor (IRF) in the range of approximately 1×1 through 10×1. In a currently preferred embodiment, the lithographic printer is a projection printer, such as a Nikon i-line projection printer, having an exposure wavelength of approximately 365 nm, an NA of approximately 0.50 and an IRF of approximately 5×1.

Figure 3:
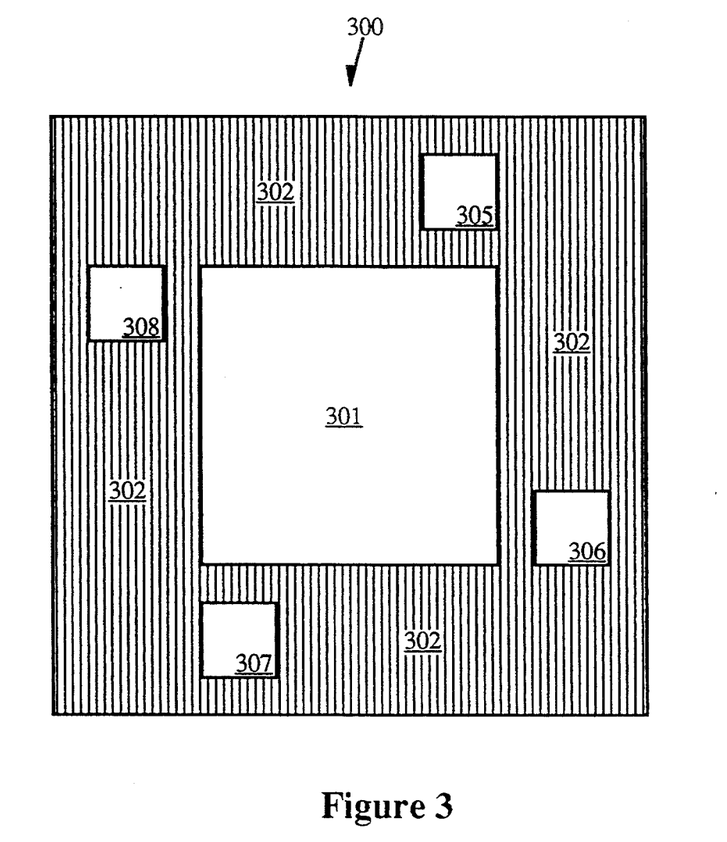
FIG. 3 shows a currently preferred embodiment of the reticle of the present invention.

FIG. 3 shows the attentuated phase-shifted reticle 300 of the present invention. Reticle 300 comprises device region 301, which contains, for example, the active device patterns of a semiconductor die being fabricated. Reticle 300 further comprises opaquing ring 302 surrounding region 301 which corresponds to, for example, the scribeline region of the wafer. Regions 305–308 contain features used for measurement, etc., as described in relation to metrology cells 105–108 of FIG. 1. Alternatively, regions 305–308 may represent regions having other types of features to be printed. As described earlier, the features in either region are formed by making openings in the attenuating layer, together with additional phase-shifting for a total phase-shift in the range of approximately 160°–200°, and more preferably approximately 180°. Thus, reticle 300 comprises a first region (e.g., device region 301) which contains first features comprising first portions which attenuate radiation transmitted therethrough, and second portions, e.g., the openings in the attenuating layer. The radiation transmitted through the first portions is phase-shifted with respect to that transmitted through the second portions.

Figure 4:
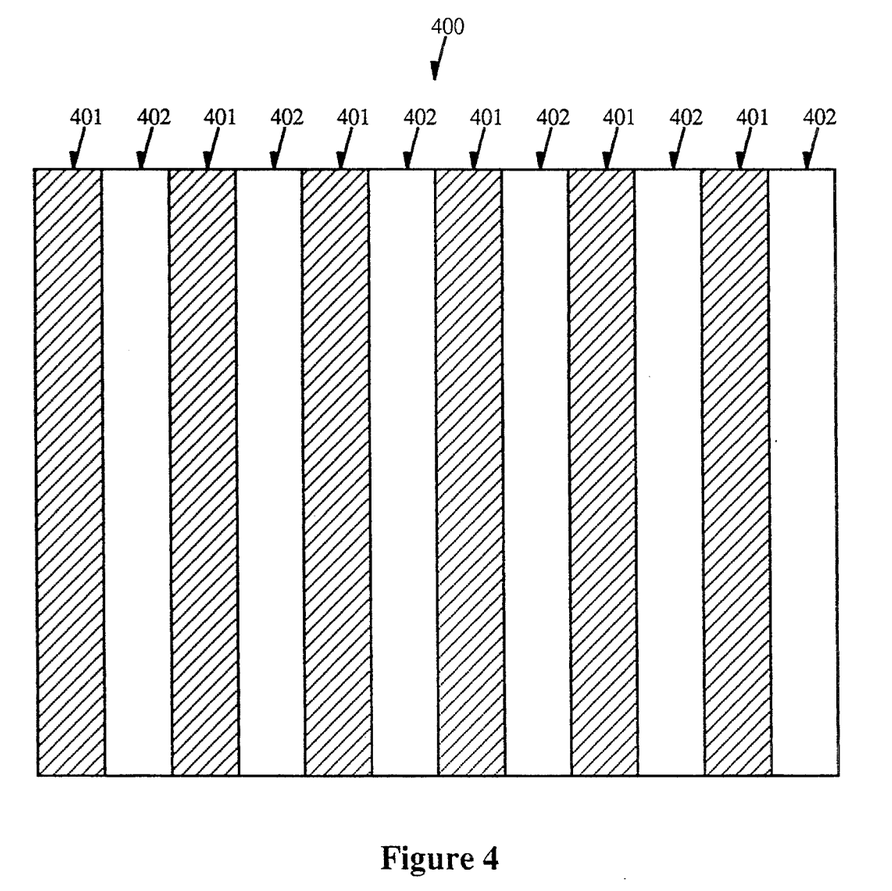
FIG. 4 shows a currently preferred embodiment of a pattern formed on a portion of the reticle of FIG. 3.
Figure 5:
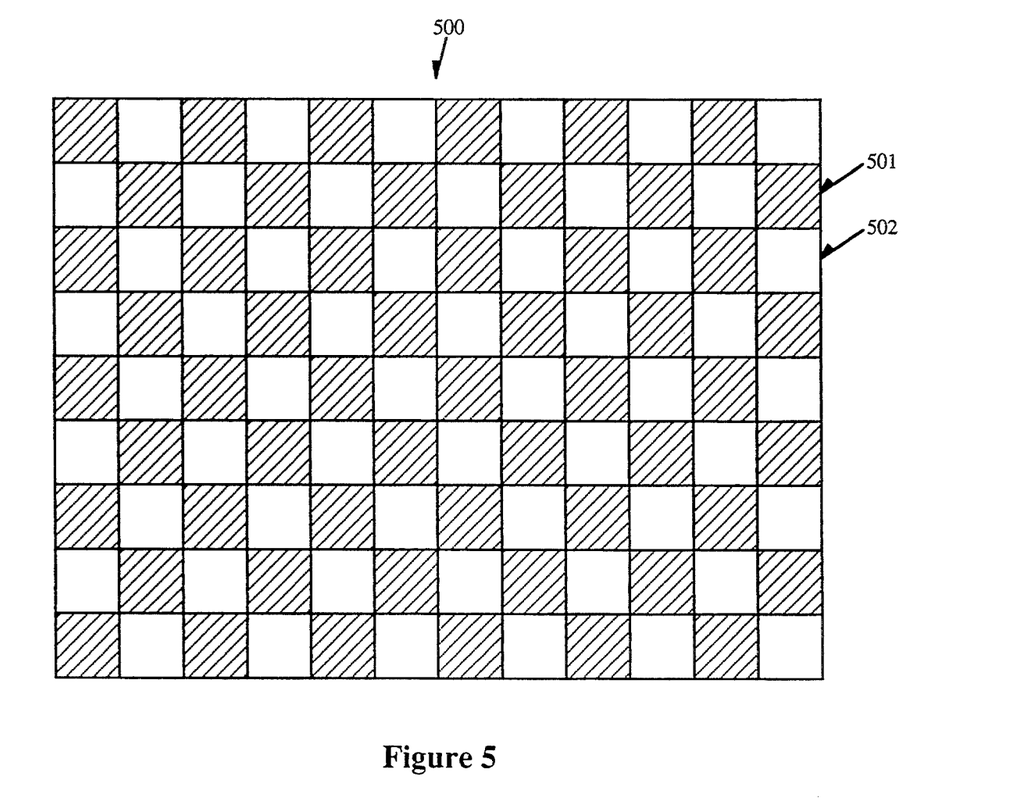
FIG. 5 shows a further currently preferred embodiment of a pattern formed on a portion of the reticle of FIG. 3.

As shown in FIG. 3, reticle 300 of the present invention has a pattern formed in regions 302 which will be more fully described in relation to FIGS. 4 and 5. Referring now to FIG. 4, one currently preferred pattern 400 of the present invention is shown. Pattern 400 comprises lines 401 and spaces 402. Pattern 400 is formed in the normal course of fabrication of the reticle. It will be understood that the terminology "lines and spaces" does not imply that one region or the other necessarily has an attenuating layer thereon. As will be seen, in some embodiments, one of either the lines 401 or spaces 402 has an attenuating layer thereon. In other embodiments, neither the lines nor the spaces have the attenuating layer thereon. For example, spaces 402 may comprise regions where the attenuating layer has been removed and which are phase-shifted by removing a thickness of quartz as described earlier. In the present invention the width of each line and space is preferably below the resolution of the printer, so that the features will not print. For example, the width of the individual lines 401 and spaces 402 should be no more than approximately 0.4 λ/NA, and preferably ≦approximately 0.2 λ/NA. Since the lines 401 and spaces 402 are below the resolution of the printer, these features will not print. Furthermore, since regions 401 and 402 are approximately 180° out of phase, they tend to cancel, thereby greatly reducing the intensity of radiation at the surface of the photoresist layer. Thus, reticle 300 comprises a second region (e.g., region 302) with first areas (e.g., lines 401) and second areas (e.g., spaces 402), wherein the radiation transmitted through the first areas is phase-shifted with respect to that transmitted through the second areas. As shown in FIG. 3, the second region (e.g., region 302) further comprises the above-described regions 305–308, which may have second features e.g., measurement features therein. Similar to the first and second portions of the first features in region 301, the second features may comprise third portions which attenuate radiation transmitted therethrough, and fourth portions, e.g., the openings in the attenuating layer.

FIG. 5 shows a further pattern of the present invention, referred to as a checkerboard pattern. In FIG. 5, regions 501 comprise regions having the attenuating layer thereon, while regions 502 comprise regions where the attenuating layer has been removed and which are additionally phase-shifted for example. As with the lines 401 and spaces 402 of FIG. 4, neither region 501 nor 502 need necessarily contain the attenuating layer and an alternative embodiment comprises the pattern shown in FIG. 5 with the attenuating layer removed from both of regions 501 and 502. Once again, the individual squares 501 and 502 shown therein have a dimension of ≦approximately 0.4 λ/NA and preferably ≦approximately 0.2 λ/NA. It will be appreciated by one skilled in the art that any number of patterns could be used to achieve the objects of the present invention. For example, in FIG. 4, the lines 401 and spaces 402 do not have to be parallel to the die edge as shown. In FIG. 5, the regions 501 and 502 may be other than square shaped. Additionally, patterns of irregular shapes and combinations of different patterns could be used. In essence, all that is needed is a preferably sub-resolution pattern of regions phase-shifted with respect to one another. Furthermore, while the features of the present invention are preferably sub-resolution, any similar pattern near or slightly above the resolution of the printer being used will show some improvement over the prior art reticle 100 shown in FIG. 2, wherein for example, metrology cell 106 is subjected to an additional uniform blanket exposure of approximately 10% of the radiation incident on reticle 100. That is, the use of the phase-shifted patterns of the present invention, even if not sub-resolution, will result in some reduction in the intensity of the overlapping exposure compared with an exposure through a uniform region 102 having the attenuating layer on the reticle base with no phase-shifted features.

Figure 6:
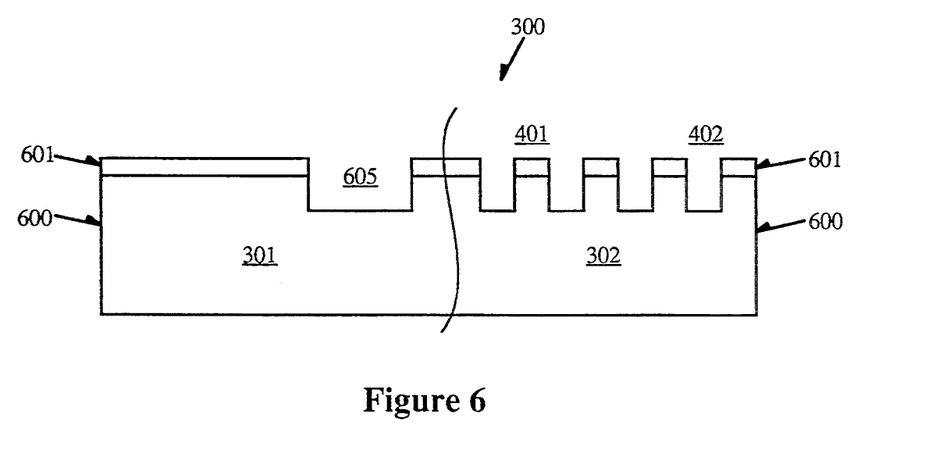
FIG. 6 shows a cross-sectional view of one embodiment of the reticle of the present invention.

FIG. 6 shows a cross-sectional view of the reticle 300 of the present invention having, for example, pattern 400 of FIG. 4 in the regions 302. The left-hand portion of FIG. 6 shows a portion in region 301 having a device feature 605. The feature is formed by making an opening in attenuating layer 601, and additionally removing a thickness of quartz reticle base 600 in the region of the opening, as described earlier. The right-hand portion of FIG. 6 shows a portion of pattern 400 in the region 302. As shown, there are a plurality of lines 401 and spaces 402 (only one line 401 and one space 402 are labeled in FIG. 6 for clarity). The removal of attenuating layer 601 and a portion of the reticle base 600 in the spaces 402 is accomplished at the same time as the formation of device feature 605. As described earlier, the attenuating layer 601, in addition to reducing the intensity of transmitted radiation to approximately 10% of the intensity incident upon reticle 300, also phase-shifts radiation approximately 20°–30°. The thickness of material necessary to phase-shift radiation 180°, $T_{180}$, is equal to:

$$T_{180} = \frac{x * \lambda}{2(n - 1)}$$

where x is an odd number integer, λ is the wavelength of the exposing radiation, and n is the index of refraction of the material. For a given thickness of attenuating layer 601 then, the amount of phase-shift, in degrees is:

180°*(actual thickness/$T_{180}$).

The amount of quartz which must then be removed can similarly be calculated by multiplying the $T_{180}$ for quartz by the ratio of additional degrees of phase-shifting required to achieve a phase-shift of 180°. The above calculations are well known in the art. It will be appreciated that the thickness of attenuating layer 601 and the amount of reticle 600 removed are not shown to scale.

Figure 7:
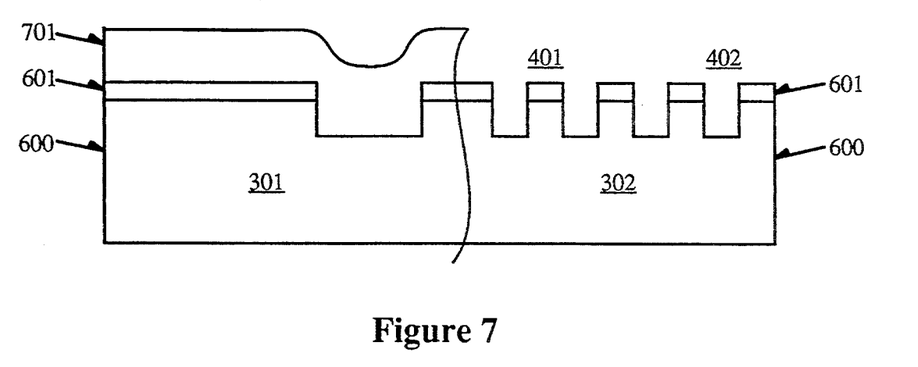
FIG. 7 shows a cross-sectional view of a further embodiment of the reticle of the present invention having a patterning layer thereon.
Figure 8:
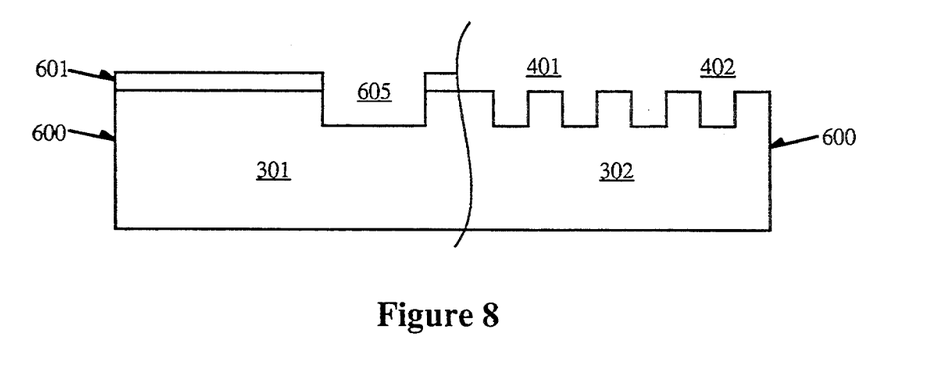
FIG. 8 shows the structure of FIG. 7 after a first preferred processing sequence.

As described earlier, the sub-resolution patterns of the present invention do not print because they are sub-resolution, and further reduce the intensity of radiation compared with the intensity present under regions 102 of reticle 100 in the prior art due to destructive interference between the lines and spaces in pattern 400 or similar regions in other patterns of the present invention. However, since the lines 401 having attenuating layers 601 transmit only 10% of the radiation transmitted through spaces 402, this destructive interference is not complete. Therefore, in a further preferred embodiment of the present invention, attenuating layer 601 is removed in the region 302. This is accomplished by, for example, forming a patterning layer 701 over the region 301 as shown in FIG. 7. Next, a chrome etch is performed to remove attenuating layer 601 in the region 302. After removal of patterning layer 701, the resulting structure is shown in FIG. 8. It should be noted that in the structure shown in FIG. 8, the lines 401 and spaces 402 are no longer out of phase to the same degree that for example, the feature 605 is compared with the surrounding field. For example, if feature 605 is phase-shifted 180°, then the lines 401 and spaces 402 will be phase-shifted approximately 150°–160°. Thus, if, due to process variations, the fabricated reticles can be expected to have a phase-shift between feature 605 and the surrounding region in the range of approximately 160°–200°, (either across a reticle or more typically from one reticle to the next) then, with an attenuating layer which shifts radiation 30°, the lines 401 and spaces 402 will have a phase-shift in the range of either 130°–170° or 190°–230°, depending upon the particular phase-shifting scheme used and the definition of 0° and of positive and negative direction. However, even in this situation, there is still a good degree of cancellation. In fact, the structure of FIG. 8 with a phase-shift of 30° more or less than 180° will result in a lesser intensity under the region 302 than the region 302 of FIG. 6 with a 180° phase-shift due to the reduced transmittance of the lines 401 in FIG. 6.

Figure 9:
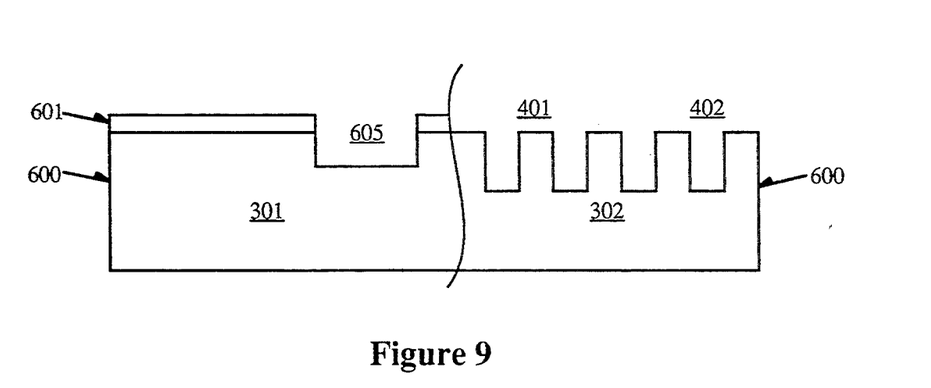
FIG. 9 shows the structure of FIG. 7 after a second preferred processing sequence.

If desired, the targeted range of 160°–200° phase-shift can be maintained for both of regions 301 and 302 in a further embodiment of the present invention. Referring to the structure shown in FIG. 7, the device regions 301 are masked with patterning layer 701, as described above. Next, a quartz etch is performed to remove a thickness of reticle base 600 sufficient to phase-shift radiation the same amount as attenuating layer 601, e.g., 20°–30°. The quartz etch is followed by a chrome etch to remove the attenuating layer 601. The resulting structure is shown in FIG. 9. As shown in FIG. 9, the spaces 402 now have an additional thickness of reticle base 600 removed compared with the feature 605, so that the phase-shift between lines 401 and spaces 402, without attenuating layer 601, is approximately the same as that between feature 605 and the surrounding region with attenuating layer 601. Thus, a targeted phase-shift of 180° can be achieved for both the device features in region 301 and the patterns of the present invention in region 302. Furthermore, depending upon the materials, thickness, and etching process used, the structure of FIG. 9 can be fabricated with a single etch step. Again referring to the structure shown in FIG. 7, the device regions 301 are masked with patterning layer 701. Next, attenuating layer 601 in the regions 302 is removed by using a quartz etch. It should be noted that since layer 601 is very thin, the amount of etch required, even when a process optimized to etch quartz is used, is small. Although a greater thickness of quartz will be removed than the thickness of attenuating layer 601, a phase-shift of approximately 180° is maintained, since, referring to the above equations, chrome has a higher index of refraction and therefore requires a lesser thickness than quartz for the same amount of phase-shift. Depending upon the thickness and material of attenuating layer 601, the quartz etch may need to be modified by, for example, using different parameters and/or different or additional species, so that a thickness of quartz sufficient to phase-shift radiation to the same extent as the attenuating layer 602 is removed. Even if the quartz etch cannot be optimized to etch the exact amount of quartz necessary to phase-shift radiation the same amount as attenuating layer 601, use of a single quartz etch step as described will result in a phase-shift in the region 302 closer to 180° than the structure of FIG. 8 where no additional quartz etch is performed in this region.

In the present invention, the patterns of the present invention are fabricated on the reticle simultaneously with the device patterns. For the embodiment shown in FIG. 6, no additional processing is required. For the embodiments shown in FIGS. 8 or 9, only one additional masking step, which does not require precise alignment, and only one or two additional etch steps are necessary beyond normal reticle fabrication.

Figure 10:
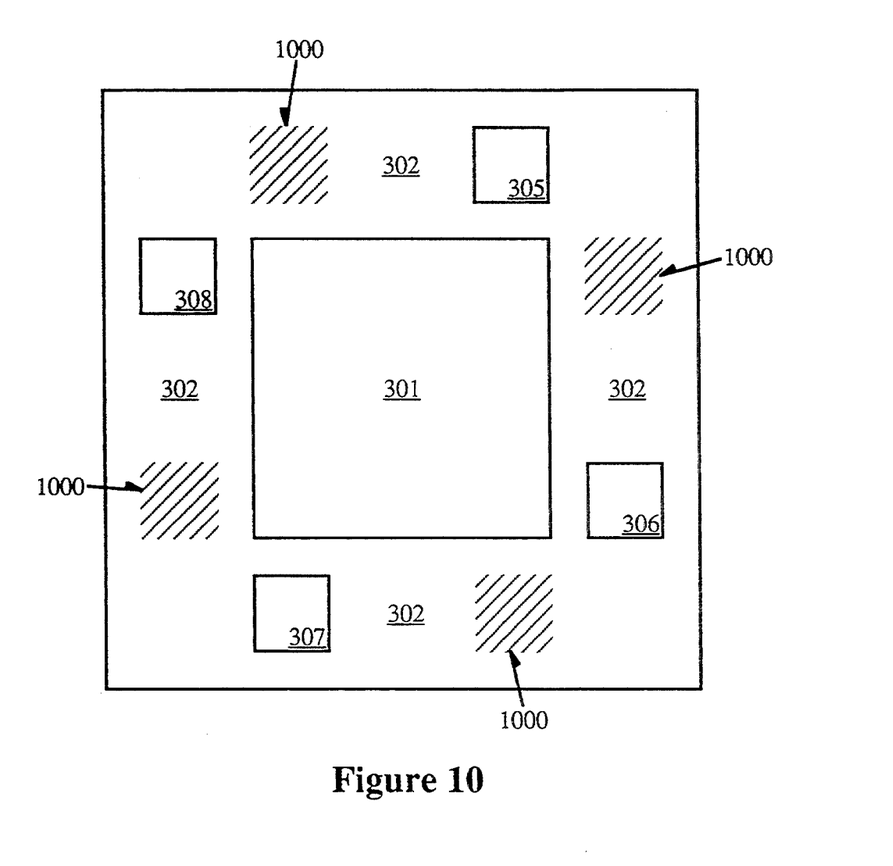
FIG. 10 shows a further currently preferred embodiment of the reticle of the present invention.

It will be appreciated that many variations to the above described embodiments may be accomplished without departing from the spirit or scope of the present invention. As mentioned above, for example, numerous near or sub-resolution patterns can be formed which reduce the intensity of radiation such that the regions 305-308 are not overexposed upon multiple exposures. In this regard, it should be noted that a reduction in intensity is sufficiently substantial when the intensity is reduced to an acceptable level for the process under consideration. For example, in some applications, it may only be necessary to leave a thin, but continuous resist layer in the scribeline region 302 for a subsequent short etch, or an etch which does not etch the resist significantly. In such a case, a non sub-resolution pattern may be sufficient, even where alternate portions of the pattern are attenuated, or even where phase-shifting between alternate portions of the pattern is other than 180°. In other cases, where a feature in the scribeline region may need to be formed with minimal degradation, it may be necessary to obtain maximum reduction in intensity by forming a pattern having dimensions well below the resolution, and further by forming the pattern in accordance with the embodiment shown and described in relation to FIG. 9. Furthermore, it will be appreciated that not all of region 302 must have a pattern of the present invention. For example, as shown in FIG. 10, a pattern 1000 of the present invention, shown by cross-hatching, can selectively be placed only in those regions which overlap the regions 305-308 of a prior or subsequent exposure. The pattern 1000 can be any of the patterns of the present invention shown or described herein.

Thus, an attenuated phase-shifted reticle, and method of making the same have been described. The invented reticle can be used in a lithography method and system incorporating multiple exposures of regions on the wafer, wherein it is desired to produce a pattern resist layer in or maintain the integrity of these regions.

What is claimed is:

1. A reticle for use in patterning a radiation sensitive layer comprising:

a first region comprising first portions and second portions, said first portions attenuating radiation transmitted therethrough relative to said second portions, wherein said first portions phase-shift radiation transmitted therethrough relative to said second portions, said first portions and said second portions defining first features;

a second region adjacent said first region comprising a pattern of first areas and second areas, wherein radiation transmitted through said first areas is phase-shifted with respect to radiation transmitted through said second areas such that intensity of radiation underneath said pattern is substantially reduced at said radiation sensitive layer.

2. The reticle as described in claim 1 wherein said second region further comprises third portions and fourth portions, said third portions attenuating radiation transmitted therethrough relative to said fourth portions, said third portions and said fourth portions defining second features.

3. The reticle as described in claim 2 wherein said second region is adjacent said first region along a first side and a second side, and wherein said second features and said pattern are positioned such that when said reticle exposes a first field and a second field such that said second side of said second region in said second field overlaps said first side of said second region in said first field, at least some of said second features of said first side are disposed in a position corresponding to a location of said second side having said pattern.

4. The reticle as described in claim 3 wherein said second features comprise metrology features.

5. The reticle as described in claim 1 wherein said pattern of said first and said second areas is below the resolution of a printer used to pattern said radiation sensitive layer.

6. The reticle as described in claim 3 wherein said pattern of said first and said second areas is below the resolution of a printer used to pattern said radiation sensitive layer.

7. The reticle as described in claim 1 wherein said reticle is exposed on a printer having a numerical aperture of NA, and an exposing wavelength of $\lambda$, and wherein said first and said second areas of said pattern have a dimension of 0.4 $\lambda$/NA or less.

8. The reticle as described in claim 3 wherein said reticle is exposed on a printer having a numerical aperture of NA, and an exposing wavelength of $\lambda$, and wherein said first and said second areas of said pattern have a dimension of 0.4 $\lambda$/NA or less.

9. The reticle as described in claim 7 wherein said first and said second areas of said pattern have a dimension of 0.2 $\lambda$/NA or less.

10. The reticle as described in claim 8 wherein said first and said second areas of said pattern have a dimension of 0.2 $\lambda$/NA or less.

11. The reticle as described in claim 1 wherein said second portions phase-shift radiation transmitted therethrough in the range of 160°-200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

12. The reticle as described in claim 3 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

13. The reticle as described in claim 5 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

14. The reticle as described in claim 7 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

15. The reticle as described in claim 9 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

16. The reticle as described in claim 1 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

17. The reticle as described in claim 3 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

18. The reticle as described in claim 5 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

19. The reticle as described in claim 7 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

20. The reticle as described in claim 9 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

21. A method of patterning a radiation sensitive layer comprising the steps of:
  a) providing a reticle, said reticle comprising:
    a first region comprising first portions and second portions, said first portions attentuating radiation transmitted therethrough relative to said second portions, wherein said first portions phase-shift radiation transmitted therethrough relative to said second portions, said first portions and said second portions defining first features;
    a second region adjacent said first region comprising a pattern of first areas and second areas, wherein radiation transmitted through said first areas is phase-shifted with respect to radiation transmitted through said second areas such that intensity of radiation underneath said pattern is substantially reduced at said radiation sensitive layer, wherein said second region is adjacent said first region along a first side and a second side;
  b) exposing a first stepping field of a substrate having said radiation sensitive layer thereon with said reticle such that a first substrate region is exposed to said first side of said second region of said reticle;
  c) stepping to and exposing a second stepping field adjacent said first stepping field, said stepping performed such that said first substrate region is exposed to said second side of said second region of said reticle.

22. The method as described in claim 21 wherein said second region of said reticle further comprises third portions and fourth portions, said third portions attenuating radiation transmitted therethrough relative to said fourth portions, said third portions and said fourth portions defining second features.

23. The method as described in claim 22 wherein when said second stepping field is exposed, at least some of said second features of said first side are disposed in a position corresponding to a location of said second side having said pattern.

24. The method as described in claim 23 wherein said second features comprise metrology features.

25. The method as described in claim 21 wherein said pattern of said first and said second areas is below the resolution of a printer used to pattern said radiation sensitive layer.

26. The method as described in claim 23 wherein said pattern of said first and said second areas is below the resolution of a printer used to pattern said radiation sensitive layer.

27. The method as described in claim 21 wherein said reticle is exposed on a printer having a numerical aperture of NA, and an exposing wavelength of λ, and wherein said first and said second areas of said pattern have a dimension of 0.4 λ/NA or less.

28. The method as described in claim 23 wherein said reticle is exposed on a printer having a numerical aperture of NA, and an exposing wavelength of λ, and wherein said first and said second areas of said pattern have a dimension of 0.4 λ/NA or less.

29. The method as described in claim 27 wherein said first and said second areas of said pattern have a dimension of 0.2 λ/NA or less.

30. The method as described in claim 28 wherein said first and said second areas of said pattern have a dimension of 0.2 λ/NA or less.

31. The method as described in claim 21 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

32. The method as described in claim 23 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

33. The method as described in claim 25 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

34. The method as described in claim 27 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

35. The method as described in claim 29 wherein said second portions phase-shift radiation transmitted therethrough in the range of 160°–200° relative to said first portions, wherein said first areas of said pattern attenuate radiation transmitted therethrough relative to said second areas of said pattern, and wherein said first areas of said pattern phase-shift radiation transmitted therethrough in the range of 160°–200° relative to said second areas of said pattern.

36. The method as described in claim 21 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

37. The method as described in claim 23 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

38. The method as described in claim 25 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

39. The method as described in claim 27 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

40. The method as described in claim 29 wherein said second portions phase-shift radiation transmitted therethrough in the range of 160°–200° relative to said first portions, wherein said first areas and said second areas of said pattern have an approximately equal transmittance, and wherein said first areas of said pattern phase-shift radiation transmitted therethrough in a range selected from the group consisting of 130°–170°, 160°–200°, and 190°–230° relative to said second areas of said pattern.

41. A method of fabricating a reticle comprising the steps of:
  providing a reticle blank having an attentuating layer thereon;
  removing portions of said attentuating layer to form first portions and second portions in a first region, wherein said second portions phase-shift radiation transmitted therethrough relative to said first portions;
  forming a pattern of first areas and second areas which phase-shift radiation transmitted therethrough with respect to each other in a second region, said first and said second areas having a dimension such that intensity of radiation underneath said pattern is substantially reduced.

42. The method as described in claim 41 wherein said pattern in said second region is formed by removing said attentuating layer from said first areas, and wherein said phase-shifting of radiation transmitted through said first portions relative to said second portions and of said first areas relative to said second areas is accomplished by removing a thickness of said reticle blank from said first portions and said first areas sufficient to phase-shift radiation transmitted through said first open portions relative to said first attenuating portions and said first areas relative to said second areas in the range of 160°–200°.

43. The method as described in claim 42 further comprising the step of removing said attentuating layer from said second areas.

44. The method as described in claim 43 further comprising the step of removing an additional sufficient thickness of said reticle blank from said first areas such that said first areas and said second areas phase-shift radiation transmitted therethrough in the range of 160°–200° with respect to each other.

45. The method as described in claim 44 wherein said steps of removing said attentuating layer from said second areas and said step of removing said additional sufficient thickness of said reticle blank from said first areas are performed using a single patterning layer.

46. The method as described in claim 45 wherein said steps of removing said attenuating layer from said second areas and said step of removing said additional sufficient thickness of said reticle blank from said first areas are performed using a single etching step.

47. The reticle as described in claim 1 wherein when a portion of said radiation sensitive layer is exposed in a first exposure and a second exposure, and said portion of said radiation sensitive layer is disposed underneath said pattern in one of said first and said second exposures, said portion of said radiation sensitive layer is not overexposed by said one of said first and said second exposures underneath said pattern.

48. The method as described in claim 21 wherein when said first substrate region is exposed to said second side of said second region of said reticle, said radiation sensitive layer is not overexposed by said exposure to said second side of said second region of said reticle.

* * * * *